(12) United States Patent
Yao et al.

(10) Patent No.: US 6,413,885 B2
(45) Date of Patent: Jul. 2, 2002

(54) METHOD FOR PATTERNING SEMICONDUCTOR DEVICES ON A SILICON SUBSTRATE USING OXYNITRIDE FILM

(75) Inventors: Liang-Gi Yao, Taipei; Pin-Ting Wang, Taichung, both of (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/865,923

(22) Filed: May 29, 2001

Related U.S. Application Data

(62) Division of application No. 09/356,006, filed on Jul. 16, 1999, now Pat. No. 6,258,734.

(51) Int. Cl.$^7$ ............................................. H07L 21/31
(52) U.S. Cl. ................................................... 438/786
(58) Field of Search .............................. 438/589, 689, 438/723, 724, 725, 743, 744, 757, 786

(56) References Cited

U.S. PATENT DOCUMENTS

| | | | |
|---|---|---|---|
| 4,717,631 A | 1/1988 | Kaganowicz et al. | 148/33.3 |
| 5,252,515 A | 10/1993 | Tsai et al. | 437/195 |
| 5,600,165 A | 2/1997 | Tsukamoto et al. | 257/323 |
| 5,639,687 A | 6/1997 | Roman et al. | 437/186 |

Primary Examiner—Michael J. Sherry
Assistant Examiner—Lisa Kilday
(74) Attorney, Agent, or Firm—George O. Saile; Stephen B. Ackerman; William J. Stoffel

(57) ABSTRACT

A method for fabricating and patterning semiconductor devices with a resolution down to 0.12 μm on a substrate structure. The method begins by providing a substrate structure comprising various layers of oxide and/or nitride formed over either monocrystalline silicon or polycrystalline silicon. A silicon oxynitride layer is formed on the substrate structure. Key characteristics of the oxynitride layer include: a refractive index of between about 1.85 and 2.35 at a wavelength of 248 nm, an extinction coefficient of between 0.45 and 0.75 at a wavelength of 248 nm, and a thickness of between about 130 Angstroms and 850 Angstroms. A photoresist layer is formed over the silicon oxynitride layer and exposed at a wavelength of between about 245 nm and 250 nm; whereby during exposure at a wavelength of between 245 nm 250 nm, the silicon oxynitride layer provides a phase-cancel effect.

5 Claims, 2 Drawing Sheets

METHOD FOR PATTERNING SEMICONDUCTOR DEVICES ON A SILICON SUBSTRATE USING OXYNITRIDE FILM

This is a division of patent application Ser. No. 09/356, 006, filing date Jul. 16, 1999, now U.S. Pat. No. 6,258,734 A Method Of Patterning Semiconductor Devices On A Silicon Substrate Using Oxynitride Film, assigned to the same assignee as the present invention.

BACKGROUND OF THE INVENTION

1) Field of the Invention

This invention relates generally to fabrication of semiconductor devices and more particularly to patterning semiconductor devices with resolution down to 0.12 μm on a silicon substrate using oxynitride film.

2) Description of the Prior Art

The semiconductor industry's continuing drive toward semiconductor devices with ever decreasing geometries coupled with the reflective property of monocrystalline silicon and polycrystalline silicon (polysilicon, poly) have led to increasing photolithographic patterning problems. Unwanted reflections from the underlying monocrystalline silicon or polycrystalline silicon during the photolithographic patterning process cause the resulting photoresist patterns to be distorted. Diffraction of the light waves used to expose the photoresist during patterning also causes distortion of the resulting patterns.

Organic and inorganic bottom anti-reflective coatings have been attempted on both monocrystalline silicon and polycrystalline silicon to absorb reflected energy and prevent pattern distortion. However, different film thicknesses due to surface topography after coating will cause etching issues, photoresist loss and poor after etch inspection (AEI) dimensions.

Phase-shifting masks have been used to compensate for diffraction and enhance the resolution of photolithographic patterns. A phase shift layer is used to cover one of a pair of adjacent apertures of the pattern mask during exposure. The phase shifting layer reverses the sign of the electric field of its aperture. The distortions of the electric field from adjacent appertures caused by diffraction cancel because they have opposite signs. The phase change is a function of wavelength and thickness of the transparent phase shifting layer. However, phase shifting masks do not prevent distortion from reflections.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,600,165 (Tsukamoto et al.) shows a SiON layer as a bottom ARC over several different structures, including polysilicon, oxide, and silicides.

U.S. Pat. No. 5,639,687 (Roman et al.) shows a Si-rich SiON ARC layer in which thickness (t) is determined as a function of wavelength (λ) and refractive index (n) using the formula t=λ/4n.

U.S. Pat. No. 5,252,515 (Tsai et al.) teaches a process for forming SiON ARC layer with refractive index (n) of between 1.5 and 2.1 by controlling the silane flow rate.

U.S. Pat. No. 4,717,631 (Kaganowicz et al.) shows a SiON passivation layer having a refractive index (n) of between 1.55 and 1.75 at a wavelength (λ) of 632.8 nm.

SUMMARY OF THE INVENTION

It is an object of the present invention to provide a method of patterning semiconductor devices on a silicon substrate using oxynitride films.

It is another object of the present invention to provide a method of patterning semiconductor devices with a resolution down to 0.12 μm on monocrystalline silicon or polycrystalline silicon.

It is yet another object of the present invention to provide a method of patterning semiconductor devices using both patterned structure and optical properties of oxynitride to achieve resolution down to 0.12 μm.

To accomplish the above objectives, the present invention provides a method for fabricating and patterning semiconductor devices with a resolution down to 0.12 μm on a substrate structure (10). The method begins by providing a substrate structure comprising various layers of oxide and/or nitride formed over either monocrystalline silicon or polycrystalline silicon. A silicon oxynitride layer (16) is formed on the substrate structure (10). Key characteristics of the oxynitride layer include: a refractive index of between about 1.85 and 2.35 at a wavelength of 248 nm, an extinction coefficient of between 0.45 and 0.75 at a wavelength of 248 nm, and a thickness of between about 130 Angstroms and 850 Angstroms. A photoresist layer (20) is formed over the silicon oxynitride layer (16) and exposed at a wavelength of between about 245 nm and 250 nm; whereby during exposure at a wavelength of between 245 nm and 250 nm, the silicon oxynitride layer (16) provides a phase-cancel effect, and acts as an inorganic anti-reflective coating, absorbing reflected light energy.

The present invention provides considerable improvement over the prior art. The absorptive properties of the oxynitride layer (20) reduce the amount of reflected energy, thereby reducing pattern distortion. A key advantage of the present invention is that during exposure, the silicon oxynitride layer (16) also provides a phase-cancel effect. The reflected light is out of phase with and cancels the diffracted light energy, further reducing pattern distortion.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

Figure 1:
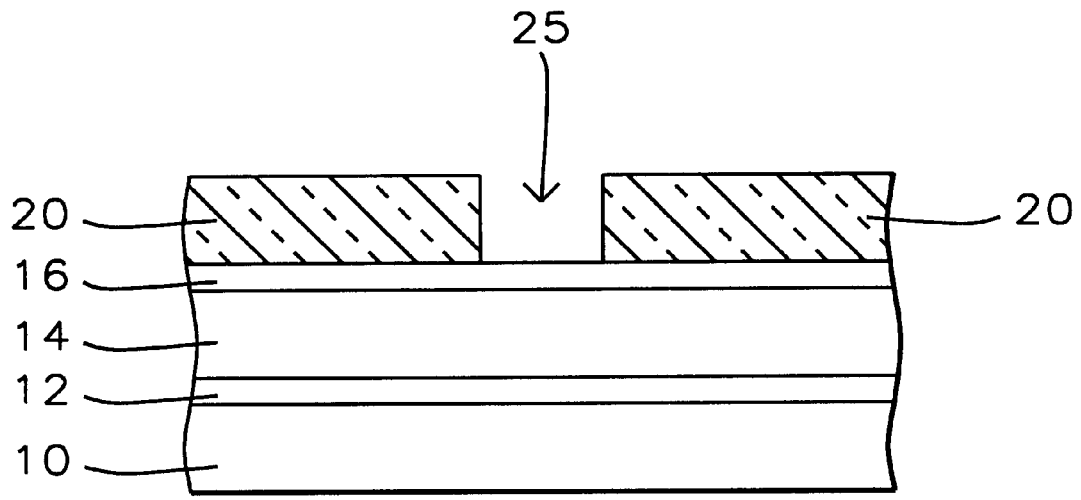
FIG. 1 is a sectional view of a device fabricated according the first embodiment of the invention.
Figure 2:
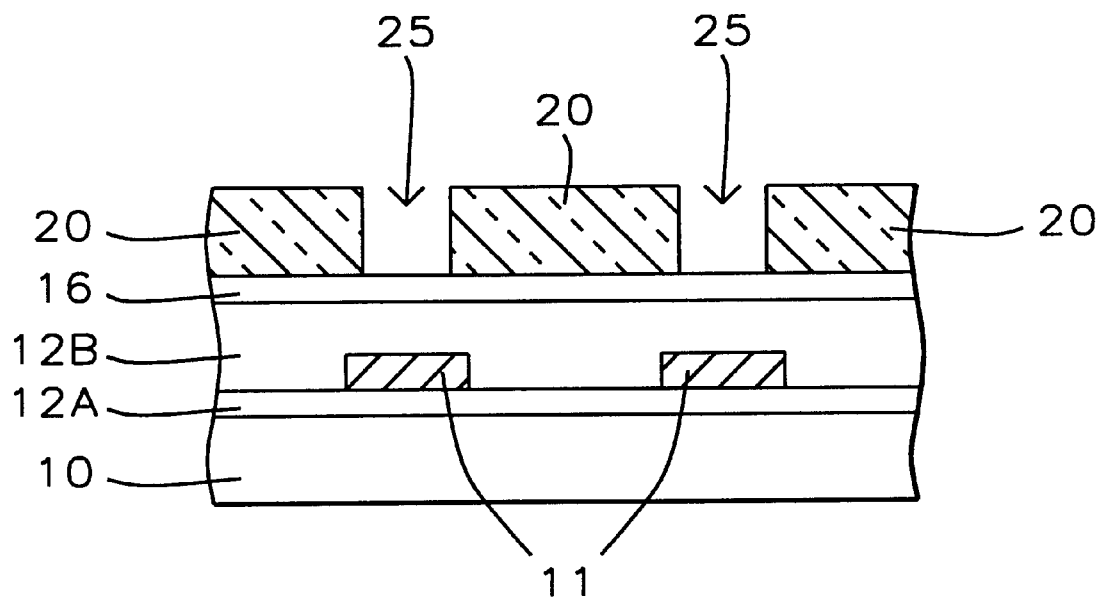
FIG. 2 is a sectional view of a device fabricated according the second embodiment of the invention.
Figure 3:
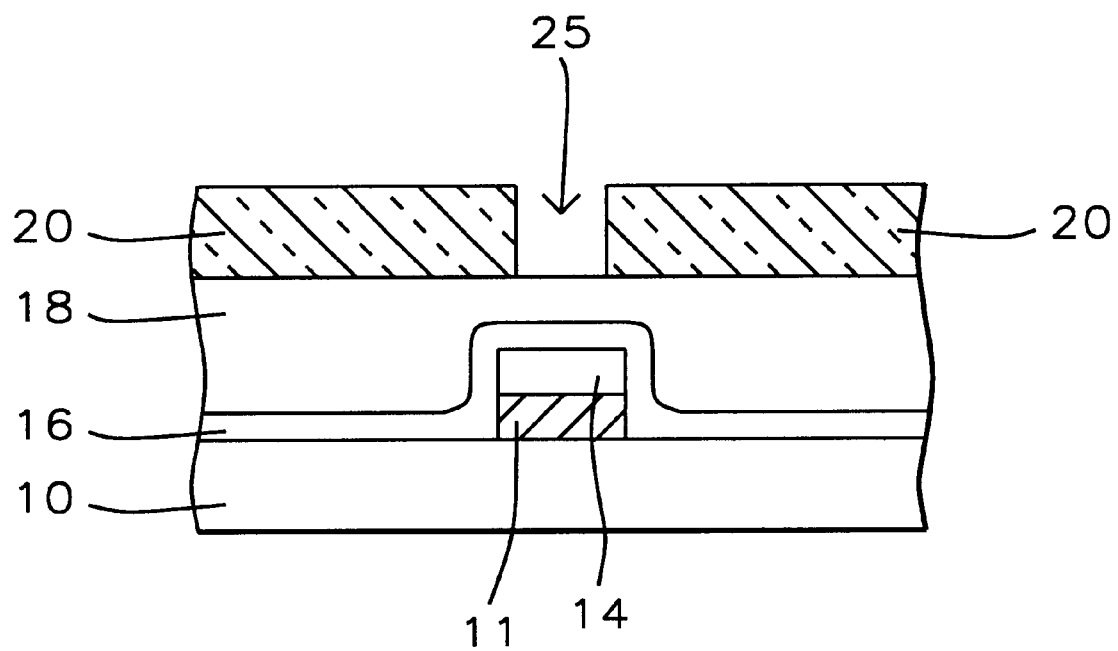
FIG. 3 is a sectional view of a device fabricated according the third embodiment of the invention.

The present invention will be described in detail with reference to the accompanying drawings.

Substrate structure as used herein means a monocrystalline silicon structure suitable for manufacturing semiconductor devices which can have one or more processing steps already performed thereon. Silicon layer as used herein means either a monocrystalline layer or a polycrystalline layer formed over a substrate structure unless otherwise stated.

First Embodiment

In the first embodiment, a silicon oxynitride layer (16) is formed over a monocrystalline silicon substrate structure (10), an oxide layer (12) and a nitride layer (14) and patterned with a resolution of down to 0.12 µm.

The process begins by forming an oxide layer (12) on a monocrystalline silicon substrate structure (10). The oxide layer (12) is preferably formed using a LPCVD process. The oxide layer preferably has a thickness of between about 50 Angstroms and 300 Angstroms.

A nitride layer (14) is formed on the oxide layer (12). The nitride layer is preferably formed using LPCVD and has a thickness of between about 1000 Angstroms and 2500 Angstroms. The nitride layer has a refractive index of between 2.28 and 2.32 and an extinction coefficient of between about 0.015 and 0.025 at a wavelength of 248 nanometers.

A silicon oxynitride layer (16) is formed on the nitride layer (14). The silicon oxynitride layer (16) has a refractive index of between about 1.85 and 2.35 and an extinction coefficient of between 0.45 and 0.75 at a wavelength of 248 nanometers. The silicon oxynitride layer preferably has a thickness of between about 130 Angstroms and 850 Angstroms.

The silicon oxynitride layer (16) can be formed using a plasma enhanced chemical vapor deposition (PECVD) process at a temperature of between about 200° C. and 550° C., at a pressure of between about 3 torr and 8 torr, and at a power of between about 120 Watts and 200 Watts. The silicon oxynitride layer (16) is preferably formed in a plasma deposition chamber such as an Applied Materials Centura or PE5000 using silane at a flow rate of between about 30 sccm and 80 sccm, nitric oxide at a flow rate of between about 50 sccm and 130 sccm, and helium at a flow rate of between about 1500 sccm and 2500 sccm. It should be understood that the flow rates and power can be scaled up or down depending upon chamber size provided the ratios are maintained.

A photoresist layer (20) is formed over the silicon oxynitride layer (16). The photoresist layer (20) has a thickness of between about 3000Angstroms and 8000 Angstroms.

The photoresist layer (20) is exposed to light energy at a wavelength of between about 245 nanometers and 250 nanometers. The absorptive properties of the oxynitride layer (20) reduce the amount of reflected energy, thereby reducing pattern distortion. A key advantage of the present invention is that during exposure, the silicon oxynitride layer (16) also provides a phase-cancel effect. The reflected light is out of phase with and cancels the diffracted light energy, further reducing pattern distortion.

The photoresist layer (20) is developed to form an opening (25). In a preferred embodiment, the oxynitride layer (16), the nitride layer (14) and the oxide layer (12) are patterned through the opening (25) to form a contact opening.

Second Embodiment

In the second embodiment, a silicon oxynitride layer (16) is formed on an oxide layer (12B) overlying a monocrystalline or polycrystalline silicon layer (11), either with or without a tungsten silicide top layer, and overlying a substrate structure (10), and patterned with a resolution of down to 0.12 µm.

The method begins by forming an oxide layer (12B) on a silicon layer (11) overlying a substrate structure (10). The oxide layer (12B) is preferably composed of a silicon glass such as undoped silicon glass (USG), boron and phosphorous doped silicon glass (BPSG) or phosphorous doped silicon glass (PSG) as are known in the art. The oxide layer (12B) of the second embodiment preferably has a thickness of between about 1000 Angstroms and 5000 Angstroms, a refractive index (n) of between about 1.4 and 1.65, and an extinction coefficient (k) of between about 0 and 0.1. The oxide layer (12B) is preferably formed using an $O_3$—TEOS process as is known in the art. In a preferred embodiment, the silicon layer (11) overlies a first oxide layer (12A), which overlies the substrate structure (10).

A silicon oxynitride layer (16) is formed on the oxide layer (12B). The silicon oxynitride layer (16) has a refractive index of between about 1.85 and 2.35 and an extinction coefficient of between 0.45 and 0.75 at a wavelength of 248 nanometers.

The silicon oxynitride layer preferably has a thickness of between about 130 Angstroms and 850 Angstroms.

The silicon oxynitride layer (16) is preferably formed by reacting silane, nitric oxide and helium in a plasma at temperatures between about 200° C. and 550° C., at a pressure of between about 3 torr and 8 torr, and at a power of between about 120 watts and 200 watts.

A photoresist layer (20) is formed over the silicon oxynitride layer (16). The photoresist layer (20) has a thickness of between about 3000 Angstroms and 8000 Angstroms.

The photoresist layer (20) is exposed to light energy at a wavelength of between about 245 nanometers and 250 nanometers and developed to form openings (25) in the photoresist layer (20).

In a preferred embodiment, the oxynitride layer (16), the nitride layer (14) and the oxide layer (12B) are patterned through the openings (25) to form a contact opening.

Third Embodiment

In the third embodiment, a silicon oxynitride layer (16) is formed over a nitride layer (14) and a monocrystalline or polycrystalline silicon layer (11), either with or without a tungsten silicide top layer, on a substrate structure (10), and patterned with a resolution of down to 0.12 µm.

The method begins by forming a nitride layer (14) on a silicon layer (11) of a substrate. The nitride layer is formed using a LPCVD process and having a refractive index of between 2.28 and 2.32 and an extinction coefficient (k) of between about 0.015 and 0.025 at a wavelength of 248 nanometers.

A silicon oxynitride layer (16) is formed on the nitride layer (14). The silicon oxynitride layer (16) has a refractive index of between about 1.85 and 2.35 and an extinction coefficient of between 0.45 and 0.75 at a wavelength of 248 nanometers. The silicon oxynitride layer preferably has a thickness of between about 130 Angstroms and 850 Angstroms.

The silicon oxynitride layer (16) is preferably formed by reacting silane, nitric oxide and helium in a plasma at temperatures between about 200° C. and 550° C., at a pressure of between about 3 torr and 8 torr, and at a power of between about 120 watts and 200 watts.

A dielectric layer (18) is formed over the oxynitride layer (16) and planarized. the dielectric layer (18) is preferably composed of doped or undoped silicon glass as is known in the art.

A photoresist layer (20) is formed over the silicon oxynitride layer (16). The photoresist layer (20) has a thickness of between about 3000 Angstroms and 5000 Angstroms. The photoresist layer (20) is exposed to light energy at a wavelength of between about 245 nanometers and 250 nanometers and developed.

In a preferred embodiment, the dielectric layer (18), the oxynitride layer (16), and the nitride layer (14) are patterned through the openings to form a contact opening.

While the invention has been particularly shown and described with reference to the preferred embodiments thereof, it will be understood by those skilled in the art that various changes in form and details may be made without departing from the spirit and scope of the invention.

What is claimed is:

1. A method of patterning semiconductor devices with a resolution down to 0.12 μm on a substrate structure comprising the steps of:
    a. forming a nitride layer on a silicon layer of a substrate structure; said nitride layer having a refractive index of between 2.28 and 2.32 at a wavelength of 248;
    b. forming a silicon oxynitride layer on said nitride layer; said silicon oxynitride layer having a refractive index of between about 1.85 and 2.35 at a wavelength of 248 nm, an extinction coefficient of between 0.45 and 0.75 at a wavelength of 248 nm, and a thickness of between about 130 Angstroms and 850 Angstroms;
    c. forming a photoresist layer over said silicon oxynitride layer; and
    d. exposing said photoresist at a wavelength of between about 245 nm and 250 nm; whereby during exposure at a wavelength of between 245 nm and 250 nm, said silicon oxynitride layer provides a phase-cancel effect.

2. The method of claim 1 wherein said nitride layer has a thickness of between about 1000 Angstroms and 2500 Angstroms.

3. The method of claim 1 which further includes forming a dielectric layer over said silicon oxynitride layer and planarizing said dielectric layer prior to forming said photoresist layer; and etching said dielectric layer, said oxynitride layer and said nitride layer to form a contact opening after exposing said photoresist layer.

4. The method of claim 1 wherein said photoresist layer has a thickness of between about 3000 Angstroms and 8000 Angstroms.

5. The method of claim 1 wherein said nitride layer is formed using a LPCVD process and said silicon oxynitride layer is formed by reacting silane, nitric oxide and helium in a plasma at temperatures between about 200° C. and 550° C., at a pressure of between about 3 torr and 8 torr, and at a power of between about 120 watts and 200 watts.

* * * * *